(12) United States Patent
Kiers et al.

(10) Patent No.: US 7,532,331 B2
(45) Date of Patent: May 12, 2009

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Antoine Gaston Marie Kiers, Veldhoven (NL); Goce Naumoski, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 383 days.

(21) Appl. No.: 11/520,789

(22) Filed: Sep. 14, 2006

(65) Prior Publication Data

US 2008/0068616 A1    Mar. 20, 2008

(51) Int. Cl.
*G01B 11/24*    (2006.01)
(52) U.S. Cl. .................. 356/601; 356/603; 250/559.22
(58) Field of Classification Search ................. 356/601, 356/603; 250/559.22
See application file for complete search history.

(56) References Cited

U.S. PATENT DOCUMENTS

| | | | |
|---|---|---|---|
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |
| 7,068,363 B2 | 6/2006 | Bevis et al. | 356/237.5 |
| 2003/0028358 A1 | 2/2003 | Niu et al. | |
| 2004/0119970 A1 | 6/2004 | Dusa et al. | 356/237.1 |
| 2004/0210402 A1 | 10/2004 | Opsal et al. | |
| 2006/0033921 A1 | 2/2006 | Den Boef et al. | |
| 2006/0066855 A1 | 3/2006 | Den Boef et al. | |
| 2006/0126074 A1 | 6/2006 | Van Der Werf et al. | 356/489 |
| 2006/0139592 A1 | 6/2006 | Den Boef et al. | 355/53 |
| 2008/0204663 A1* | 8/2008 | Balogh | 353/10 |

* cited by examiner

*Primary Examiner*—Roy Punnoose
(74) *Attorney, Agent, or Firm*—Sterne, Kessler, Goldstein & Fox P.L.L.C.

(57) ABSTRACT

In target shape reconstruction, in order to determine efficiently and quickly the profile of complex targets on a substrate, the various degrees of freedom or variable parameters of the various shapes of which a single profile is made up can be reduced by linking together the variable parameters using simple formulae or by approximating the shape of the overall profile such that it takes in to account the various shapes making up that profile. Fewer parameters gives rise to fewer iterations of calculations on those parameters, which increases the speed of profile reconstruction.

12 Claims, 5 Drawing Sheets

INSPECTION METHOD AND APPARATUS, LITHOGRAPHIC APPARATUS, LITHOGRAPHIC PROCESSING CELL AND DEVICE MANUFACTURING METHOD

BACKGROUND OF THE INVENTION

1. Field of the Invention

The present invention relates to methods of inspection usable, for example, in the manufacture of devices by lithographic techniques and to methods of manufacturing devices using lithographic techniques.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

In order that the radiation that impinges on to the substrate is diffracted, objects with a specific profile are printed on to the substrate and are often known as scatterometry profiles. Ideally, the objects that are printed on to the substrate would have a predetermined shape and would be printed perfectly each time they were printed. However, because of the size (of the order of a few nanometers) of the objects, it is desirable to have a system to determine how exactly the objects are shaped; i.e. it is desirable to know the profiles of the objects. The objects may be diffraction gratings and the like which are made up of an array of bars or other periodic structures but have a cross-section, which is the profile from the surface of the substrate upwards.

As mentioned above, it is possible to determine the actual shape of a scatterometry object using scanning electron microscopes and the like. However, this involves a large amount of time, effort and apparatus.

Another way in which to determine the profile of a scatterometry object is to diffract a beam of radiation from the object and compare the diffraction pattern with model diffraction patterns that are stored in a library of diffraction patterns alongside the model profiles that create these model patterns. This general concept is known in the art. For example, U.S. Patent Application Publication 2003/0028358 A1 (Niu et al.) describes a system in which an actual signal from a scatterometry object is compared with a library of stored signals and the system tries to find a closest match of signals. The stored signals are each linked to an object profile parameter. An object profile parameter may be, for instance, the critical dimension (CD), a width of the object (which may vary with height), the height of the object or the angle of a side surface of the object, this angle being measured either from the surface of the substrate or from a normal to the substrate surface. The document goes on to describe the method as finding a closest match of a signal with each parameter of the scatterometry object. In other words, various possible parameters and possible permutations of parameters are tested to find a combination that gives rise to a signal that is as close to the actual signal that has come from the scatterometry object as possible. This gives a series of iterations of a "model signal". This method is repeated iteratively until the model signal is as close as possible to the actual signal and then the model signal is stored alongside the parameters used. Finally, a computer checks a database comprising the parameters to determine if all parameter combinations have been entered. In a given example, for a simplified parameter set of three (a CD, a height and a width), if the range of the CD is 100 to 120 nm and the resolution is 1 nm, then there are 21 possible parameter values for CD. If there are also 21 possible values for height and 21 possible values for width, there are a total of 21×21×21=9261 possible parameter value combinations. The computer checks to see if all 9261 combinations have been simulated and stored in the database. The computer builds the database by simulating all of the possible combinations. Clearly, the problem with this system is that the greater the number of parameters, the greater the number of iterations that the computer must carry out and the greater the processing power and time that is required.

U.S. Patent Application Publication 2004/0210402 A1 (Opsal et al.) defines a system that aims to reduce the number of parameters required to build up the profile of an object from the scatterometry signals. The way the system does this is by providing "control points" around the outside of the profile shape from which the profile shape may be built up. For example, a square-profiled object has a single control point to show its height from the substrate surface and two points to show a width. The points are then joined up in a "dot-to-dot" fashion to give a line profile. The more complex the shape, the larger the number of control points is required to build up an accurate line profile. Furthermore, this system does not work well for overlapping shapes (e.g. complex shapes that look like overlapping simpler shapes or a profile that has a coating) or multiple shapes in a single profile, as the lines joining the dots may easily join the wrong dots.

Another problem with this system is that each control point will have at least one (if not two or three) degree of freedom. Each degree of freedom translates to a parameter that may change and the computing power is not reduced by very much, even though the parameters are changed.

SUMMARY OF THE INVENTION

It is desirable to provide a system that reduces the number of degrees of freedom of measurement points or parameters in a scatterometry object in order to provide a quick method of reconstructing the profile of a scatterometry object from its diffraction spectrum.

According to an embodiment of the invention, a method of reconstructing the shape of an object from a diffraction pattern resulting from radiation illuminating the object comprises detecting the diffraction pattern of radiation diffracted from the object; estimating the object shape; deriving a model diffraction pattern from the estimated shape; comparing the model diffraction pattern and the detected diffraction pattern; determining the actual object shape from the difference between the model diffraction pattern and the detected diffraction pattern, wherein the object shape is defined as a plurality of two- or three-dimensional shapes each with a plurality of variable geometric parameters; and linking together the variable geometric parameters of the different two- or three-dimensional shapes to give an approximation of an object shape defined by a two- or three-dimensional shape with a reduced number of variable parameters.

According to another embodiment of the invention, a method of determining an actual profile of an object, the object having been printed on a substrate, comprises (i) receiving an actual spectrum signal associated with the object; (ii) selecting a first model profile; (iii) generating a first model spectrum signal associated with the first model profile; (iv) comparing the first model spectrum signal with the actual spectrum signal; and, if the first spectrum signal and the actual spectrum signal do not match to a desired tolerance, (v) carrying out (ii) to (iv) with a second model profile, wherein the second model profile is selected based on the first model spectrum signal having undergone an optimization process based on each of a number of variable parameters of the first model profile, the number of variable parameters having been reduced by approximating the first model profile to a single shape with a reduced number of variable parameters.

According to another embodiment of the invention, an inspection apparatus, a lithographic apparatus or a lithographic cell configured to measure a property of a substrate comprises (i) a detector configured to receive an actual spectrum signal associated with an object on the substrate; (ii) a controller configured to select a first model profile; (iii) a generator configured to generate a first model spectrum signal associated with the first model profile; (iv) a comparator configured to compare the first model spectrum signal with the actual spectrum signal; and if the first spectrum signal and the actual spectrum signal do not match to within a desired tolerance, (v) the controller, generator and comparator are configured to carry out (ii) to (iv) with a second model profile, wherein the second model profile is selected based on the first model spectrum signal having undergone an optimization process based on each of a number of variable parameters of the first model profile, the number of variable parameters having been reduced by approximating the first model profile to a single shape with a reduced number of variable parameters.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
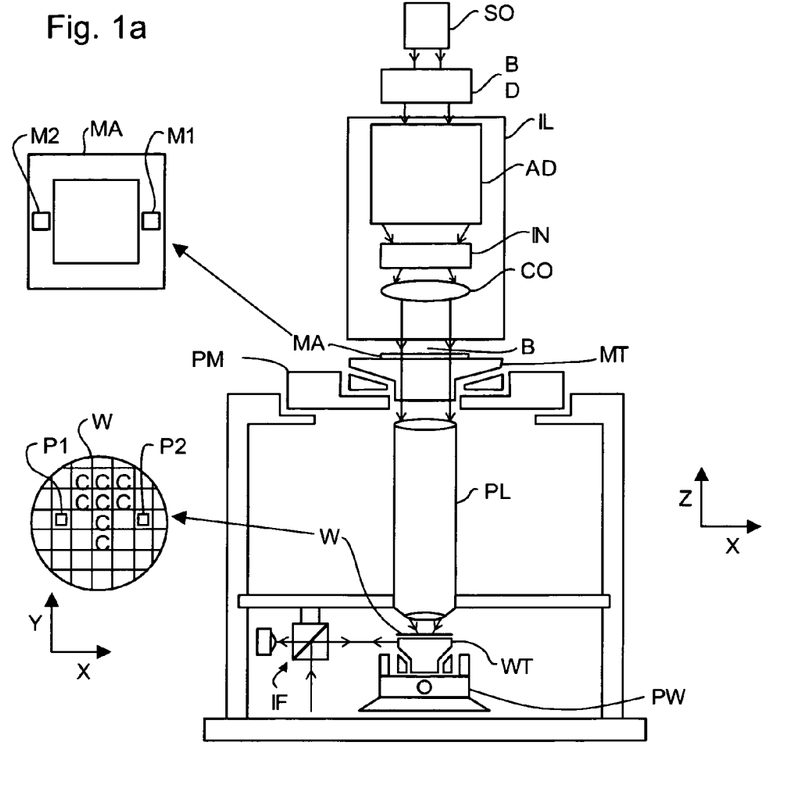
FIG. 1a depicts a lithographic apparatus.

FIG. 1a schematically depicts a lithographic apparatus. The apparatus comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PL is configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
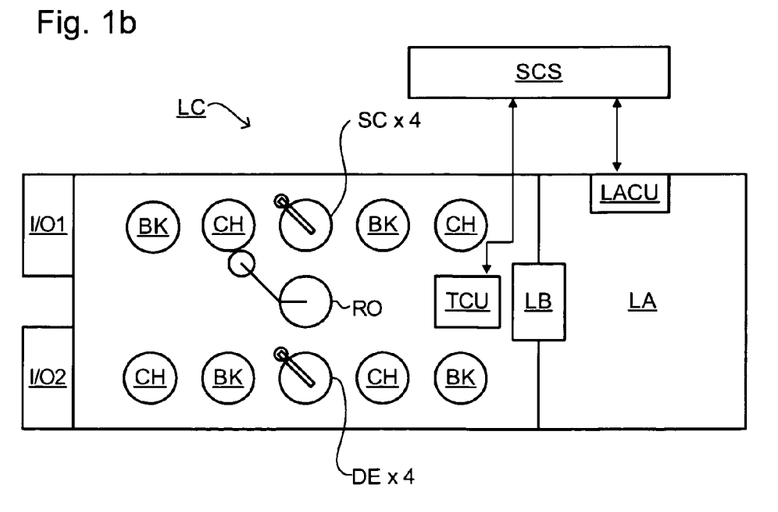
FIG. 1b depicts a lithographic cell or cluster.

As shown in FIG. 1b, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked, to improve yield, or discarded, thereby avoiding performing exposures on substrates that are known to be faulty. In a case where only some target portions of a substrate are faulty, further exposures can be performed only on those target portions that are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast, there is only a very small difference in refractive index between the parts of the resist that have been exposed to radiation and those that have not, and not all inspection apparatus have sufficient sensitivity to make useful measurements of the latent image. Therefore measurements may be taken after the post-exposure bake step (PEB), which is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

Figure 2:
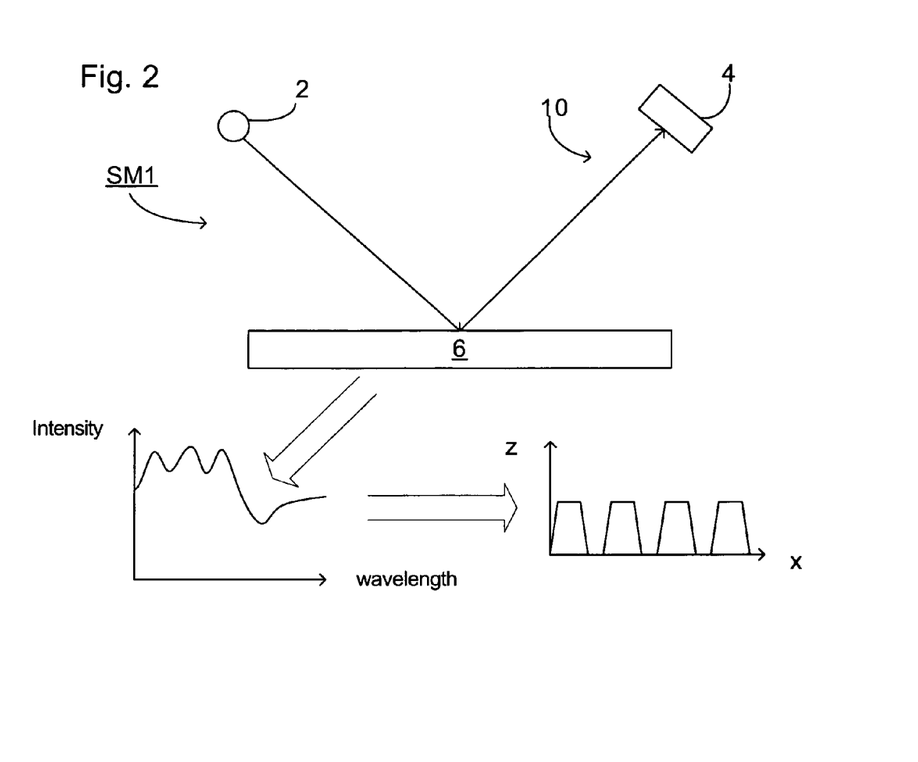
FIG. 2 depicts a first embodiment of a scatterometer.

FIG. 2 depicts a scatterometer that may be used in the present invention. It comprises a broadband (white light) radiation projector 2 that projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconfigured, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
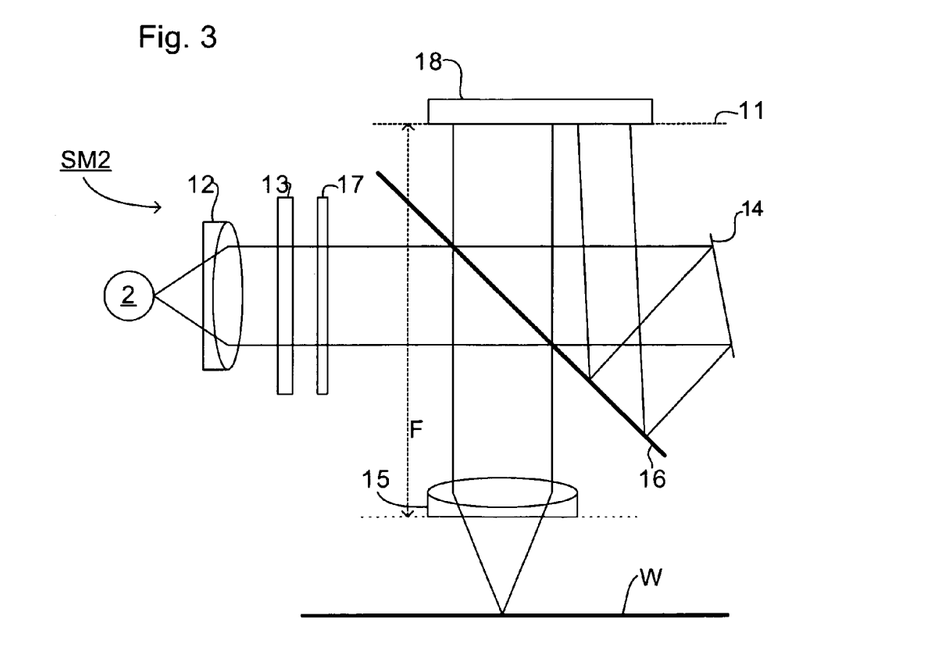
FIG. 3 depicts a second embodiment of a scatterometer.

Another scatterometer that may be used with the present invention is shown in FIG. 3. In this device, the radiation emitted by radiation source 2 is focused using lens system 12 through interference filter 13 and polarizer 17, reflected by partially reflected surface (beam splitter) 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation, and any substantially conjugate plane. The detector is preferably a two-dimensional detector so that a two-dimensional angular scatter spectrum of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the beam splitter 16, part of it is transmitted through the beam splitter as a reference beam towards a reference mirror 14. The reference beam is then projected onto a different part of the same detector 18.

A set of interference filters 13 is available to select a wavelength of interest in the range of, for example, 405-790 nm or even lower, such as 200-300 nm. The interference filter may be tunable rather than comprising a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic, and transverse electric-polarized light and/or the phase difference between the transverse magnetic- and transverse electric-polarized light.

Using a broadband light source (i.e. one with a wide range of light frequencies or wavelengths, and therefore of colors) is possible, which gives a large etendue, allowing the mixing of multiple wavelengths. The plurality of wavelengths in the broadband preferably each has a bandwidth of $\lambda\delta$ and a spacing of at least $2\lambda\delta$ (i.e. twice the wavelength). Several "sources" of radiation can be different portions of an extended radiation source that have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in U.S. Patent Application Publications 2006/0066855 A1 and 2006/0033921 A1.

The target on substrate W may be a grating, which is printed such that after development, wherein the bars of the grating are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process from knowledge of the printing step and/or other scatterometry processes.

The present invention relates to the reconstruction of the target on the substrate W. The bars of the grating have a shape that includes their length and the shape of their cross section, as they are generally assumed to be prism-shaped. The cross-sectional shape of a bar is known as its profile. Hereafter, a bar will be referred to as a scatterometry object. It must be noted, however, that the profile may also comprise the entire 3-D object and not simply its cross-section. An example of this is when the scatterometry object is an array of "contact holes". These contact holes are regarded as being made up of conical and cylindrical shapes such as that shown in FIG. 9. This particular example will be discussed later.

For reconstruction purposes, the profile is generally regarded as being made up of a stack of homogeneous rectangular cross-sectioned layers and trapezoids (or cylinders and cones as mentioned above). A radiation beam is diffracted from the surface of the scatterometry object. This diffracted beam is detected by a detector that then creates a scatterometry measurement signal from the diffraction pattern. The measurement signal is compared with a calculated signal that is based on a model profile defined by a stack of homogeneous layers and trapezoids. When the calculated signal does not match the measured signal, the model profile is altered so that the associated model signal is more similar to the actual profile of the actual object. This process is continued until the measurement signal and the calculated signal do match within acceptable tolerances. The degrees of freedom that can be changed during each iteration are, for example, the height, the critical dimension (CD), the sidewall angle (e.g. the angle of the side wall of the profile with respect to either the substrate surface or a normal to the substrate surface), an angle between tangents (or normals) of rounded sides, etc., or non-geometric parameters such as the refractive index of the materials from which the trapezoids are made or other optical constants. With each iteration, a new calculation is carried on a profile with at least one changed degree of freedom in order to produce a new model signal to compare with the measured signal.

A homogeneous layer that has, for example, a rectangular cross-section, has only a single geometric degree of freedom and that is its thickness (or height from the substrate surface). A trapezoid, on the other hand, has for example three degrees of freedom: its height, its sidewall angle and its CD at its bottom surface. A cone has at least two degrees of freedom: its height and its base diameter. The greater the number of degrees of freedom, the larger the chance of instable solutions and cross-correlations between the different degrees of freedom (the degrees of freedom are also known as the variable parameters). By "instable solution," the following is understood: it is assumed that the change in the calculated signal is different for each degree of freedom. In reality, the change in the calculated signal of different geometrical parameters can be similar, which makes it difficult for the optimization algorithm to find the right solution. In an example, a stack of two trapezoids is the object for which the profile is being estimated. Increasing the height of the first trapezoid by a few nm and at the same time decreasing the height of the second trapezoid by a few nm will yield very similar calculated signals (especially if the overall height remains the same). Since the measurement signals are not free of noise, 100 measurements of the same target will result in a wide variety of results. These results are known as instable results. In other words, there is cross correlation between parameters; i.e. the change in the measurement signal can be explained by either a change in degree of freedom A, or a change in degree of freedom B. Sometimes the optimization algorithm will choose A, sometimes B. It is the solution to this instability that is sought with the present invention.

A large number of degrees of freedom occur when the profile of the object comprises two or more different shapes that are stacked. For example, if one trapezoid is stacked upon another, the increasing of the height of the lower trapezoid is strongly correlated with a decrease in height of the upper trapezoid such that the overall height remains the same. Instable solutions result in errors in the measurement of the profiles and so the reconstructions of the targets on the substrate W are likely to be flawed.

Classic reconstruction methods do not cope with large numbers of degrees of freedom very well. If there are, for example, M trapezoids in a profile, each with N degrees of freedom, classic methods have to deal with M×N degrees of freedom if discontinuities in the profile are taken into account and N+M(N−1) degrees of freedom if the profiles do not have discontinuities (e.g. in the case of neatly stacked trapezoids).

Another problem with this classic reconstruction method is that only a single profile can be modeled at any one time. However, there are cases when more than one profile is present in a unit cell, for example, in double patterning applications.

When two trapezoids are stacked to generate a more complex profile, the bottom of the top trapezoid is "attached" to the top of the bottom trapezoid. In the following examples, the bottom trapezoid will be called the "foot" and the top trapezoid will be called the "main segment". Traditionally, the foot height and main segment height are separate degrees of freedom. They are therefore separate parameters that can be adjusted independently and thus contribute to the iteration of calculations that must be carried out to determine the overall profile of the object. The present invention seeks to reduce the number of degrees of freedom, thus stabilizing the calculations. In order to do this, a relationship is established between the height of the foot "F" and the height of the main segment "M" using simple mathematical formulae; for example:

$$F = 0.2 \times M; \tag{a}$$

$$F = 30 + 0.1 \times M; \text{ or} \tag{b}$$

$$F = 30 + M - M_{nominal} \tag{c}$$

In general, therefore, any degree of freedom or variable parameter can be linked to any other degree of freedom or variable parameter using a simple formula. Even the refractive index of the material of a trapezoid may be linked to the height of the trapezoid in specific processes such as chemical vapor deposition (CVD).

The deduction of the formulae to be used is carried out as follows: before starting the building of a scatterometry model, a Focus Exposure Matrix (FEM) is measured. In a FEM, patterns are printed with a variety of focus and dose settings, which create a large variation in profiles. By measuring the profile cross-sections of known object shapes, one can deduce the rules of the profiles and their associated scatterometry results. Making these physical cross-sections takes a considerable amount of computational time. Different rules can be experimented with and chosen such that a particular rule can be obtained that combines both a good stability of the results and small to no differences between the measured and calculated signals.

By linking degrees of freedom with each other, the number of degrees of freedom is reduced, leading to shorter calculation times, and more stable end results.

Figure 4:
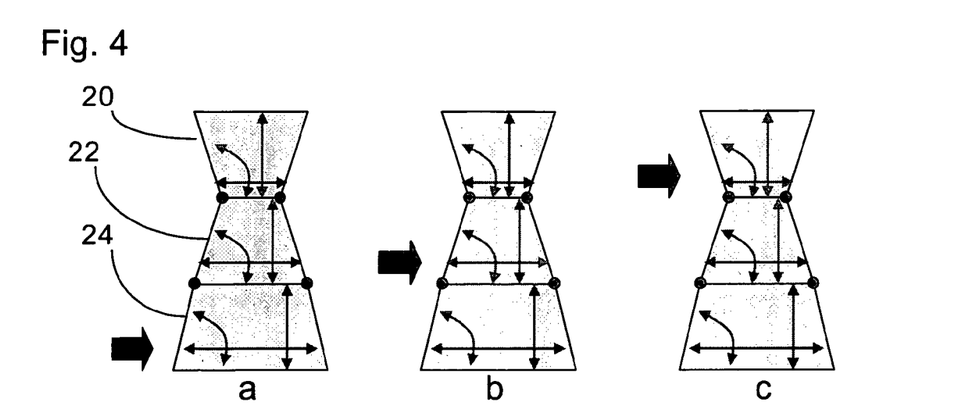
FIG. 4 depicts three stages of the method according to the present invention.
Figure 5:
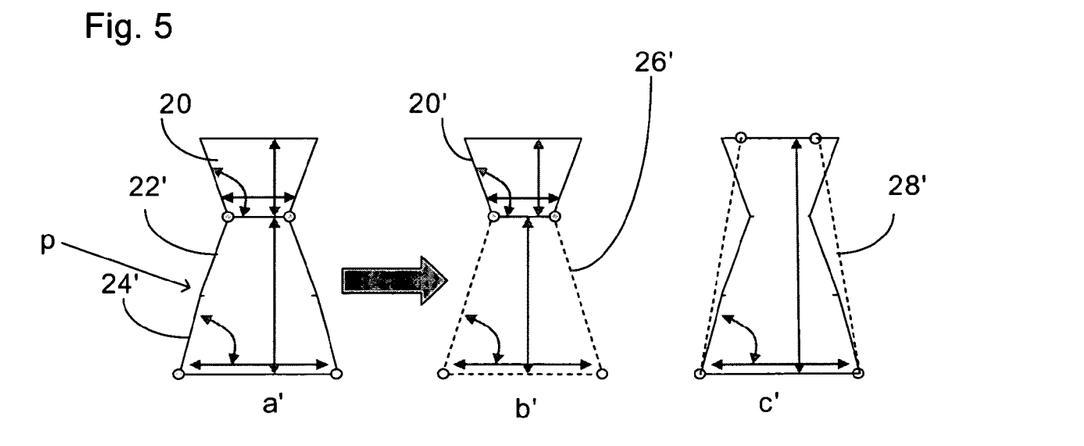
FIG. 5 depicts three further stages of the method according to the present invention.

FIGS. 4 and 5 show the method carried out to link the various degrees of freedom. Any group of shapes can be transformed into an object with at most three degrees of freedom by linking the degrees of freedom of the component shapes together.

In FIG. 4, a stack of three trapezoids 20, 22, 24 is shown with a total number of degrees of freedom of 7. The height and side angle of each of the trapezoids 20, 22, 24 are each independent degrees of freedom. However, the width of each of the trapezoids may be linked. In section a of FIG. 4, for example, the width of the top two trapezoids 20, 22 may be linked and so the width of the bottom trapezoid 24 is the seventh degree of freedom, along with the height and side wall angle of each of the trapezoids. In section b of FIG. 4, the top and bottom trapezoid 20, 24 widths can be linked and so the middle trapezoid width is the seventh degree of freedom. In section c of FIG. 4, it may be the width of the top trapezoid that is the independent degree of freedom. The widths of the different trapezoids are linked so that there are no discontinuities in the profile shape. In other words, the bottom CD of one trapezoid must match the top CD of the adjacent trapezoid so that the profile of the two trapezoids together is continuous, as shown in FIG. 4, for example. Once the CD of one trapezoid is known, the CDs of the other trapezoids can be calculated using the sidewall angles and heights of the trapezoids.

By combining the bottom two trapezoids 22, 24 of FIG. 4, the two bottom trapezoids 22', 24' of FIG. 5 can be treated as a single polygon p with only three degrees of freedom, as shown in section a' of FIG. 5. In section b', the bottom, larger trapezoid 26' made up of the two trapezoids has three degrees of freedom and the top trapezoid 20' also still has three degrees of freedom. The single polygon p is now regarded as a single trapezoid, 26'. Figure c' of FIG. 5 shows all three trapezoids 20', 22', 24' linked together to form a single trapezoid 28' with only three degrees of freedom for the whole profile.

The linking of degrees of freedom as shown in FIG. 4 or the combining of shapes as shown in FIG. 5 both reduce the number of degrees of freedom, leading to more stable results. The results are more stable because if there is only one degree of freedom, then any change in measured signal has to be translated into a change in that single parameter. If there are many degrees of freedom, then many combinations of different parameters will result in similar differences between the measured and calculated signal. The fewer the number of degrees of freedom, the more likely one of those degrees of freedom is to be the key to matching the estimated and actual profiles. The calculation is therefore more robust.

Figure 6:
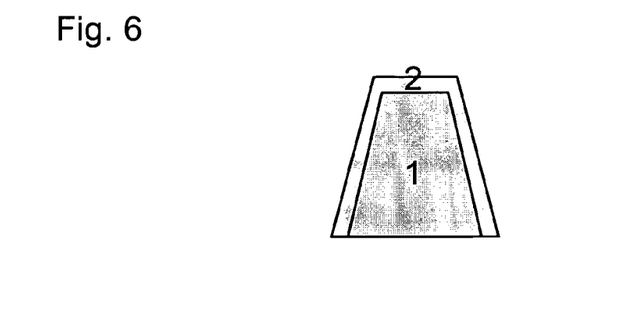
FIG. 6 depicts overlapping profiles.

This method works for several types of profile shapes. There are scatterometry objects for which the profile is made of overlapping shapes. For example, a thin coating 2 may be provided around a grating bar 1 as shown in FIG. 6. The shapes of the coating and of the grating bar may be determined separately and then combined to obtain the profile of the coated bar. However, linking the two shapes enables the possibility of keeping the coat thickness constant or allow for scaling when one of the profiles changes. With this definition, it is much easier to define and control coatings on a profile. For example, bottom CD of coated element=bottom CD of main element+10 nm;  (d)

height of coated element=height of main element+5 nm;  (e)

sidewall angle of coated element=sidewall angle of main element.  (f)

The coating thickness can be known from previous measurements or experimenting with an FEM as described above.

Figure 7:
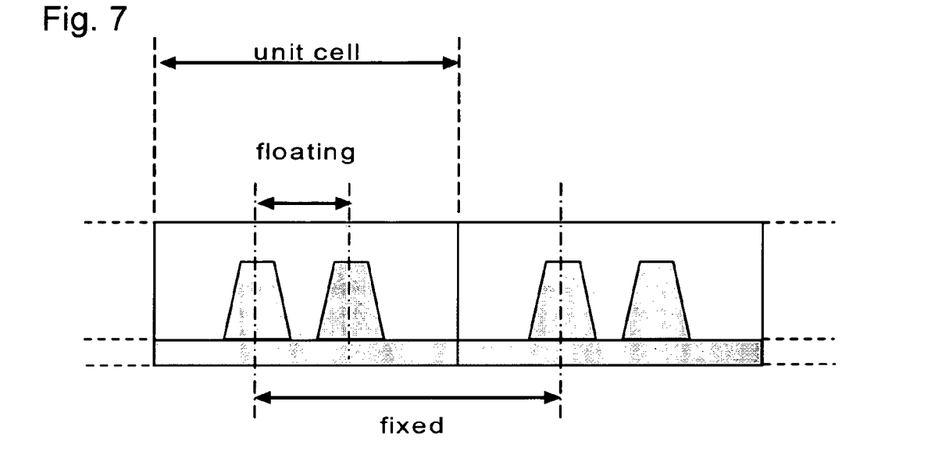
FIG. 7 depicts a plurality of profiles in a single cell.

As mentioned above, it is possible to have more than one profile in a unit cell as shown in FIG. 7. Using a unit cell with linked degrees of freedom of the two profiles also helps to reduce the degrees of freedom required for the calculations to reconstruct the profiles. This allows for the modeling of gratings or targets that are printed with alternating phase shifting masks that contain a small phase error. The profiles in the same unit cell do not have to have the same parameters.

Figure 8:
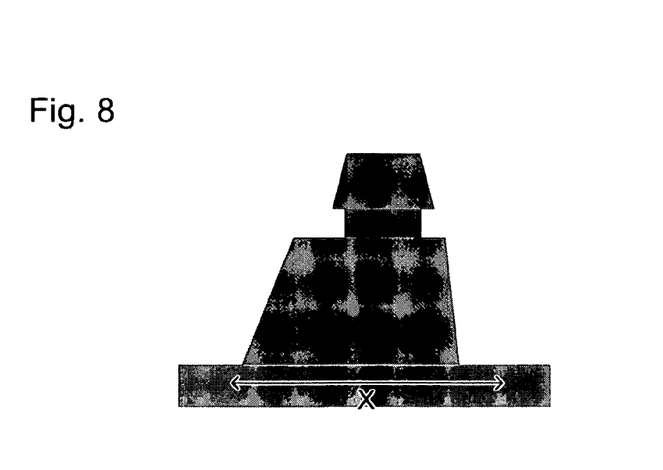
FIG. 8 depicts an asymmetrical profile.

Usually, the centers of the various shapes within an object profile are horizontally aligned. This makes the calculations easier for a symmetrical profile. However, it is possible to have an asymmetrical profile such as that shown in FIG. 8. Knowing the X-positions (i.e. the relative horizontal alignments) of the different shapes enables modeling of more complex profiles. The linking of these profiles enables an efficient calculation even when shapes change. For example:

Left sidewall angle of element $A$=right side wall angle of element $A$+3▒  (g)

Only the right sidewall angle has to be defined and then the left sidewall angle can be calculated.

Figure 9:
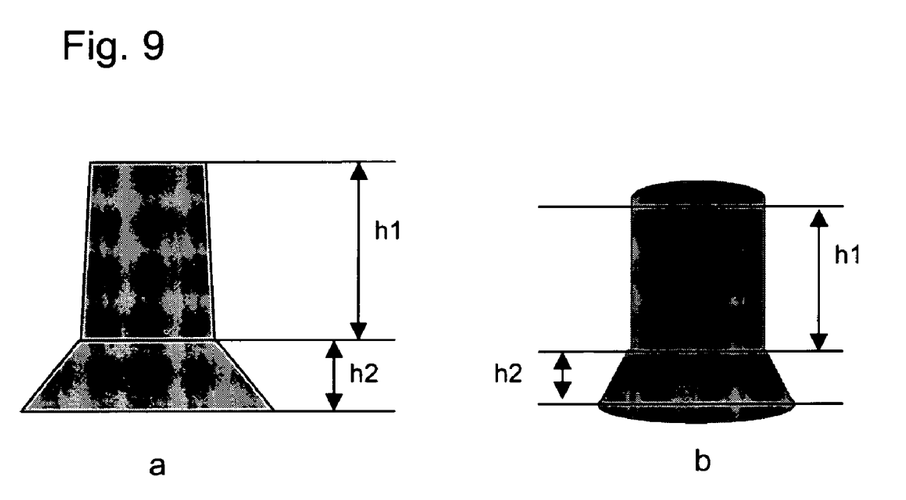
FIG. 9 depicts a two-dimensional object shape and its equivalent three-dimensional object shape.

This method also works for 3-D shapes such as that shown in FIG. 9. Section a shows a side view of a shape that is made up of a cylinder stacked on top of a frustum. The cylindrical part has a height h1 and the frustum has a height h2. h1 and h2 may be linked such that one is dependent on the other in the same way as the foot and main segment of the trapezoid described in equations (a) to (c) above.

The advantages of having fewer degrees of freedom and therefore fewer parameters to measure gives more stable results. Calculation time is therefore reduced, minimizing cost and taking less time to discover a solution. More complex profiles may also therefore be handled.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of reconstructing the shape of an object from a diffraction pattern resulting from radiation illuminating the object, the method comprising:

detecting the diffraction pattern of radiation diffracted from the object;

estimating the object shape;

deriving a model diffraction pattern from the estimated shape;

comparing the model diffraction pattern and the detected diffraction pattern;

determining the actual object shape from the difference between the model diffraction pattern and the detected diffraction pattern, wherein the object shape is defined as a plurality of two- or three-dimensional shapes each with a plurality of variable parameters; and linking together the variable parameters of different trapezoids to give an approximation of an object shape defined by a two- or three-dimensional shape with a reduced number of variable parameters.

2. The method according to claim 1, wherein the two- or three-dimensional shape is a trapezoid.

3. The method according to claim 1, wherein the variable parameters include geometric parameters.

4. The method according to claim 1, wherein the variable parameters include the refractive index of the material of the object.

5. The method according to claim 1, wherein the shape of the object comprises at least two two- or three-dimensional shapes, each of the two- or three-dimensional shapes having at least two variable parameters each, the at least two variable parameters comprising at least a height and a width of each of the two- or three-dimensional shapes.

6. The method according to claim 5, wherein a further variable parameter of each two- or three-dimensional shape is an angle between the sides of two joining sides of the two- or three-dimensional shape.

7. The method according to claim 6, wherein in the two- or three-dimensional shape has a curved side, and the angle is between chosen tangents of the two joining sides.

8. The method according to claim 1, wherein a variable parameter of the object shape is a degree of freedom of the object's shape as a result of the process of printing the object onto the substrate.

9. The method according to claim 1, wherein the object shape comprises at least one two- or three-dimensional shape stacked on at least one other two- or three-dimensional shape.

10. The method according to claim 1, wherein the object shape comprises at least a first two- or three-dimensional shape within at least a second two- or three-dimensional shape, such that the at least second two- or three-dimensional shape defines a coating around the at least first two- or three-dimensional shape.

11. The method according to claim 1, wherein an object shape comprises a plurality of separate two- or three-dimensional shapes that are not touching each other.

12. The method according to claim 1, wherein the object shape is asymmetrical and the method further comprises: defining the relative alignment of a plurality of shapes making up the object profile such that each of the plurality of shapes is modeled separately and combined subsequently.

* * * * *